(12) United States Patent
Nagashima

(10) Patent No.: US 8,880,387 B2
(45) Date of Patent: Nov. 4, 2014

(54) INFORMATION PROCESSING APPARATUS AND INFORMATION PROCESSING METHOD

(75) Inventor: Fumitada Nagashima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 394 days.

(21) Appl. No.: 13/298,164

(22) Filed: Nov. 16, 2011

(65) Prior Publication Data

US 2012/0136642 A1　May 31, 2012

(30) Foreign Application Priority Data

Nov. 25, 2010　(JP) .................................. 2010-262872

(51) Int. Cl.
*G06F 9/455*　(2006.01)
*G06F 17/50*　(2006.01)
*G06F 9/445*　(2006.01)

(52) U.S. Cl.
CPC .................. *G06F 17/5027* (2013.01)
USPC .............................................. 703/24; 703/27

(58) Field of Classification Search
USPC ............... 703/22, 23, 27, 24; 710/1; 714/38.1
See application file for complete search history.

(56) References Cited

U.S. PATENT DOCUMENTS

| 5,963,736 | A | * | 10/1999 | Sarno et al. | 703/27 |
| 5,991,824 | A | * | 11/1999 | Strand et al. | 710/1 |
| 2004/0044514 | A1 | * | 3/2004 | Granny et al. | 703/23 |
| 2004/0111248 | A1 | * | 6/2004 | Granny et al. | 703/22 |
| 2005/0036034 | A1 | * | 2/2005 | Rea et al. | 348/207.1 |
| 2012/0079325 | A1 | * | 3/2012 | Riegel et al. | 714/38.1 |

FOREIGN PATENT DOCUMENTS

JP　　　　2005-78402 A　　　3/2005

* cited by examiner

*Primary Examiner* — Thai Phan
(74) *Attorney, Agent, or Firm* — Canon USA, Inc. IP Division

(57) ABSTRACT

An information processing apparatus connected to an emulator to arrange a verification model and a verification target includes a compile unit configured to create a first data transfer unit arranged in a computer to transfer data from the computer to the emulator based on a description of a file function of a verification program and a generation unit configured to generate a second data transfer unit that receives the data from the first data transfer unit and transfers the received data to the verification target based on the description of the file function.

11 Claims, 7 Drawing Sheets

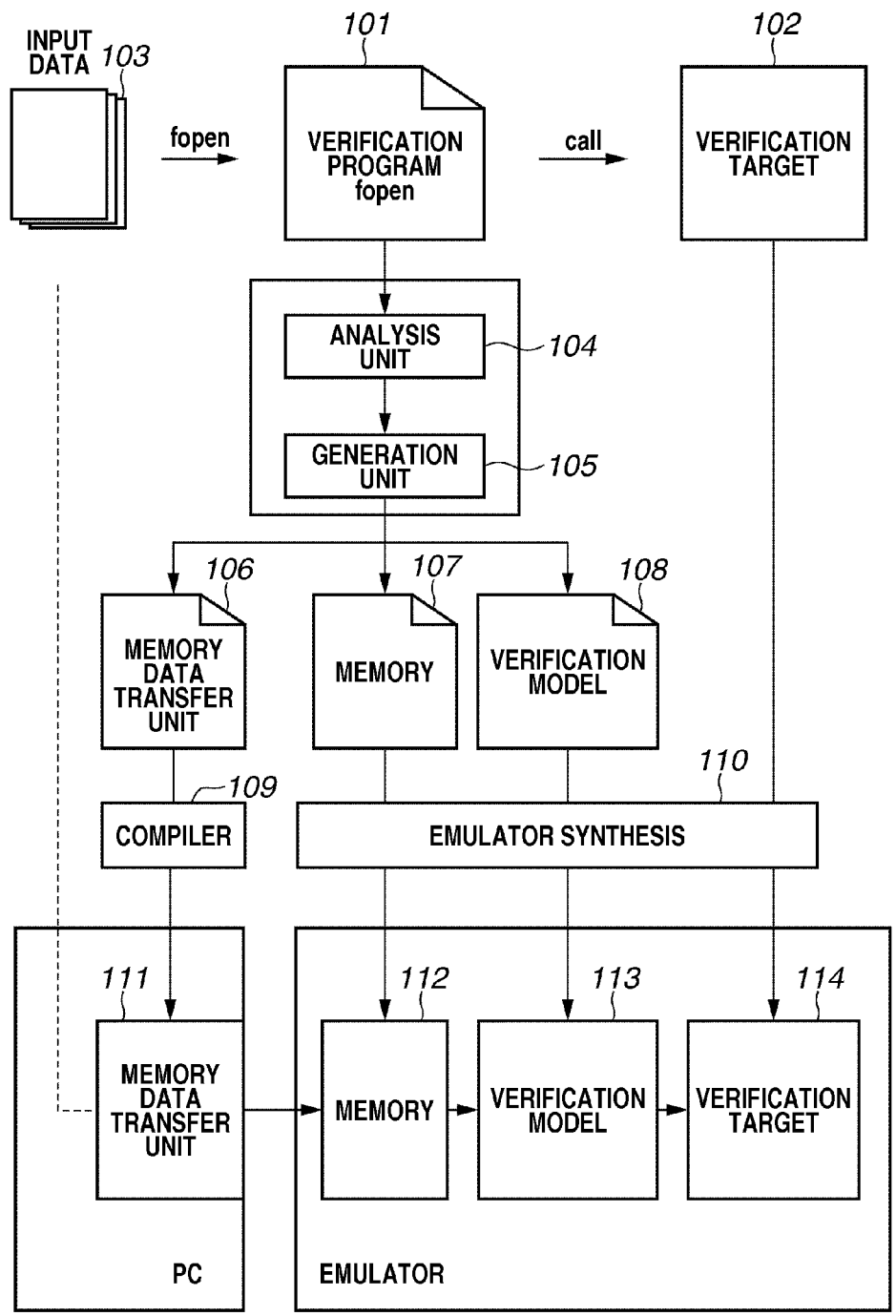

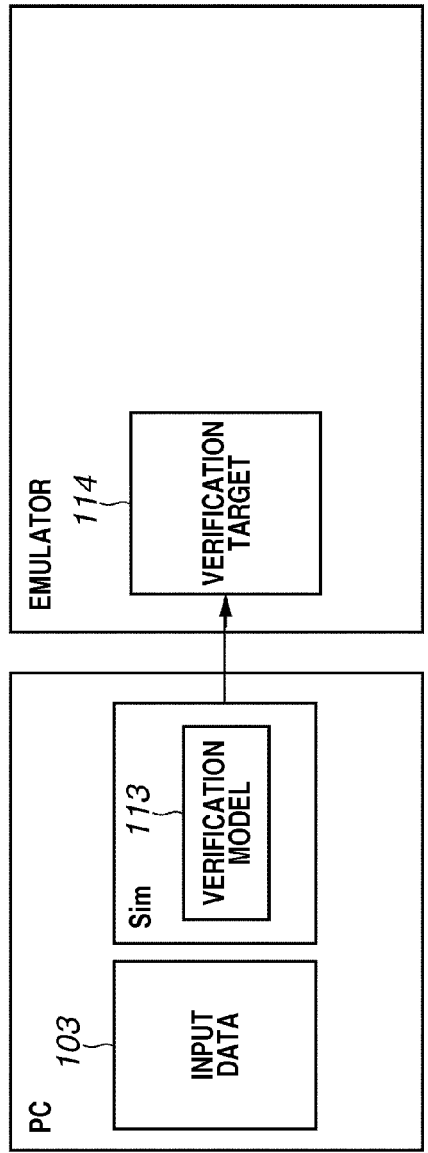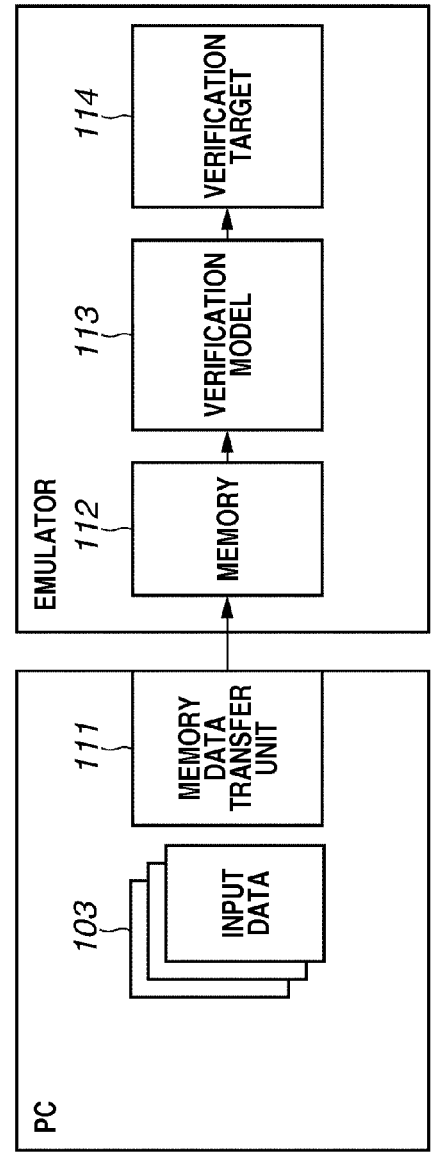

FIG.4A

VERIFICATION PROGRAM
(C LANGUAGE)

```
1: FILE*fp;
2: int getf,
3: int out_ data;
4: fp=fopen("indata.bin","rb");
5:
6: while(1){
7: getf = fgetc(fp);
8: if(getf == EOF) break;
9: out_data(getf);
10:
11: }
```

FIG.4B

VERIFICATION MODEL
(C LANGUAGE CAPABLE OF
SYNTHESIZING BEHAVIORS)

```
1: int mem[32],i;
2:
3: for(i=0;1<32;i++){
4: out_data(mem[i]));
5: }
6: trig_out();
```

FIG.4C

MEMORY DATA
TRANSFER UNIT (Verilog)

```
1: for(i=0;1<20000;i++)
2: filename = "file".i
3: readmemh(filename,mem)
```

INFORMATION PROCESSING APPARATUS AND INFORMATION PROCESSING METHOD

BACKGROUND OF THE INVENTION

1. Field of the Invention

The present invention relates to an information processing apparatus and an information processing method that create an environment for emulation by using a verification model in logic circuit design.

2. Description of the Related Art

In the logic circuit design, the behavior of a designed logic circuit needs to be verified. Hardware used for verification includes a reconfigurable logic integrated circuit (IC) and a hardware emulator configured by a specific central processing unit (CPU) (hereinafter, a hardware emulator will be denoted simply as an emulator).

If the method of verifying behavior by supplying prepared input data to a verification target is used, as illustrated in FIG. 2A, a circuit of a verification target 114 is arranged on the side of an emulator. Also, a verification model 113 is mounted on a computer (hereinafter, referred to as a PC) as a program. Then, input data 103 is transferred from the PC to the verification target 114 on the side of the emulator.

However, when emulating processing in which a large-capacity image is input as input data, data transfer from the PC to the emulator occurs by unit of clock events of emulation and thus, the speed of emulation is controlled by communication between the PC and emulator.

Thus, as illustrated in FIG. 2B, a method by which the verification model 113 and a memory 112 are arranged on the emulator side together with the verification target 114 and a memory data transfer unit 111 is implemented on the PC side as a program is known. At first, according to this method, the memory data transfer unit 111 on the PC side transfers the input data 103 to the memory 112 playing the role of a buffer on the emulator side. Next, the verification model 113 supplies data in the memory 112 to the verification target 114.

By using this method, the memory data transfer unit 111 on the PC side can collectively transfer, to the emulator, the input data 103 corresponding to the capacity of the memory 112 playing the role of a buffer. In other words, the communication from the PC to the emulator by unit of clock events is not needed, so that the verification can be made faster.

To build a high-speed emulation environment as illustrated in FIG. 2B, it is necessary to design the verification model 113 in a register transfer level (RTL) hardware description language. In recent years, a design method in which a logic circuit is designed at a high level of abstraction and then RTL is generated by behavioral synthesis is adopted. According to this method, a behavioral description realizing a desired behavior of a logic circuit is designed and the behavioral description is converted into RTL by using behavioral synthesis tools.

Moreover, it is necessary to perform verification to check whether the designed behavioral description implements the desired behavior correctly. A verification program used for verification of the behavioral description is designed in a behavioral description at a high level of abstraction of the C language or the like.

Thus, a method of implementing the verification program on the emulator by behavioral synthesis can be considered. To verify supplying input data prepared as a file to the verification target, the verification program has a description of file input/output. A file pointer is specific to software and does not exist in hardware and thus, behavioral synthesis cannot be performed directly.

Japanese Patent Application Laid-Open No. 2005-78402 enables behavioral synthesis of a verification program designed with a behavioral description having a description of file input/output. If the behavioral synthesis is applied, a description of a file function in the verification program is converted into a verification model described in a hardware description language that does not allow logic synthesis.

A verification model containing a file function generated by the method discussed in Japanese Patent Application Laid-Open No. 2005-78402 does not allow logic synthesis and logic synthesis cannot be used when implemented on a PC, imposing heavy loads on the user. Also, according to the method discussed in Japanese Patent Application Laid-Open No. 2005-78402, the memory 112 playing the role of a buffer does not exist and thus, like the configuration in FIG. 2A, a high-speed emulation environment cannot be realized.

Thus, as described above, design based on logic synthesis cannot be used to build a high-speed emulation environment including a behavior of file input/output and therefore, heavy loads are imposed on the user.

SUMMARY OF THE INVENTION

According to an aspect of the present invention, an information processing apparatus connected to an emulator to arrange a verification model and a verification target includes a compile unit configured to create a first data transfer unit arranged in a computer to transfer data from the computer to the emulator based on a description of a file function of a verification program and a generation unit configured to generate a second data transfer unit that receives the data from the first data transfer unit and transfers the received data to the verification target based on the verification program.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 1 illustrates a configuration of an exemplary embodiment of the present invention.

FIGS. 2A and 2B illustrate an outline configuration of an emulation environment.

FIGS. 4A to 4C illustrate description examples of a verification program, a verification model, and a memory data transfer unit.

DESCRIPTION OF THE EMBODIMENTS

Various exemplary embodiments, features, and aspects of the invention will be described in detail below with reference to the drawings.

Figure 7:
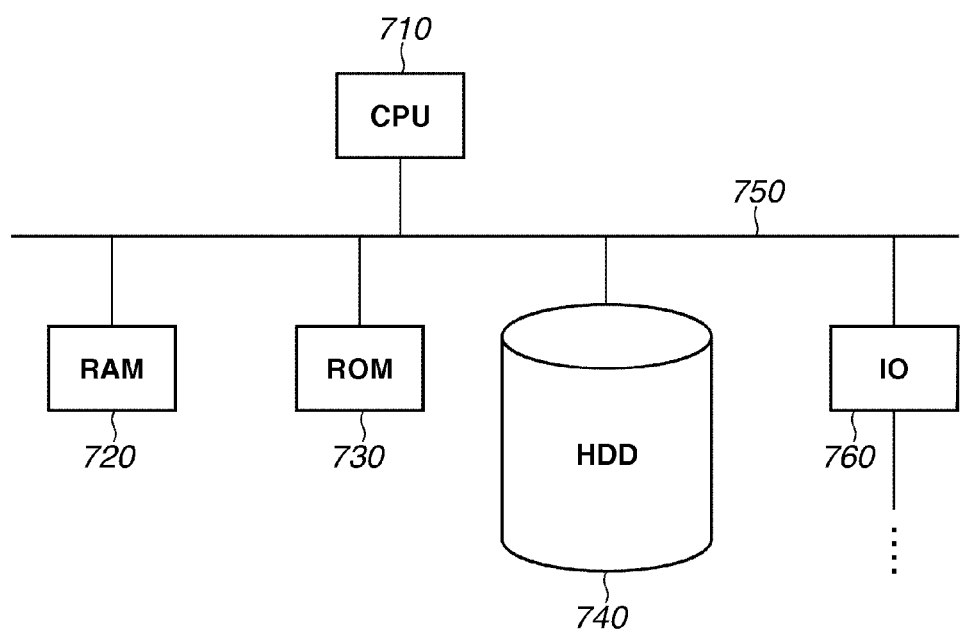
FIG. 7 illustrates an outline configuration of an information processing apparatus.

A first exemplary embodiment will be described. FIG. 7 illustrates the outline configuration of an information processing apparatus of the present invention. A storage apparatus (such as an hard disk drive (HDD)) 740 and a read-only memory (ROM) 730 store a verification program, an operating system (OS), and a program and compiler for behavioral synthesis or logic synthesis and a CPU 710 reads code of these programs into a random access memory (RAM) 720 for execution if necessary. An IO 760 is an input/output unit and an interface capable of inputting/outputting data by being connected to an emulator or an external device holding data. A bus 750 connects the ROM 730, the RAM 720, the CPU 710, the HDD 740, and the IO 760 so that data and commands can be communicated therebetween.

In the description of the present exemplary embodiment below, a gate circuit (program) arranged in the emulator and an interface (program) arranged on the PC are created by the information processing apparatus (hereinafter, referred to as a PC) illustrated in FIG. 7 through conversion into the C language allowing behavioral synthesis, behavioral synthesis, logic synthesis, and compilation. Next, an emulation environment is created by arranging (outputting) the created gate circuit (the memory 112 as a second data transfer unit, the verification model 113, and the verification target 114) in the emulator via the IO 760 and arranging the created interface (the memory data transfer unit 111 as a first data transfer unit described below and a trigger detector 122) on the PC.

FIG. 1 illustrates an outline configuration of a verification model generation system (or a verification model generation apparatus) according to the first exemplary embodiment of the present invention. In FIG. 1, a verification program 101 is written in the C language or the like and contains a description of a file function. A verification target 102 is a signal processing circuit, encryption circuit, error correction circuit, image processing circuit, or the like described in the C language or the like by using an algorithm and has the input data 103 from the verification program 101 supplied as a target. Input data 103 is a file containing image data and the like.

An analysis unit 104 analyzes and determines whether there is any description of a file function in the verification program 101 (whether behavioral synthesis or logic synthesis is possible). If a description of a file function is detected by the analysis unit 104, a generation unit 105 extracts the description of the file function to generate a memory data transfer unit model 106 (hereinafter, referred to as a data transfer unit) arranged on the PC, the memory model 112 (hereinafter, referred to simply as the memory 112) functioning as a buffer and implemented on the emulator, and the verification model 113. A compiler 109 implements the memory data transfer unit 106 (and the trigger detector 122) as a first logic circuit on the PC. An emulator synthesis unit 110 implements a memory 107, a verification model 108, and the verification target 102 on the emulator as a second logic circuit by using behavioral synthesis tools or logic synthesis tools. Incidentally, the logic synthesis indicates synthesis of a gate circuit (netlist) from an RTL description and the behavioral synthesis indicates synthesis of an RTL description from a behavioral description described in the C language or the like. The behavioral description describes a behavior in the processing order.

The memory data transfer unit 111 implemented as a program on the PC transfers the input data 103 to the memory 112 on the emulator. The memory 112 implemented on the emulator sends data received from the memory data transfer unit 111 to the verification model after buffering the data. The verification model 113 implemented on the emulator supplies data in the memory 112 to the verification target 114.

Figure 5:
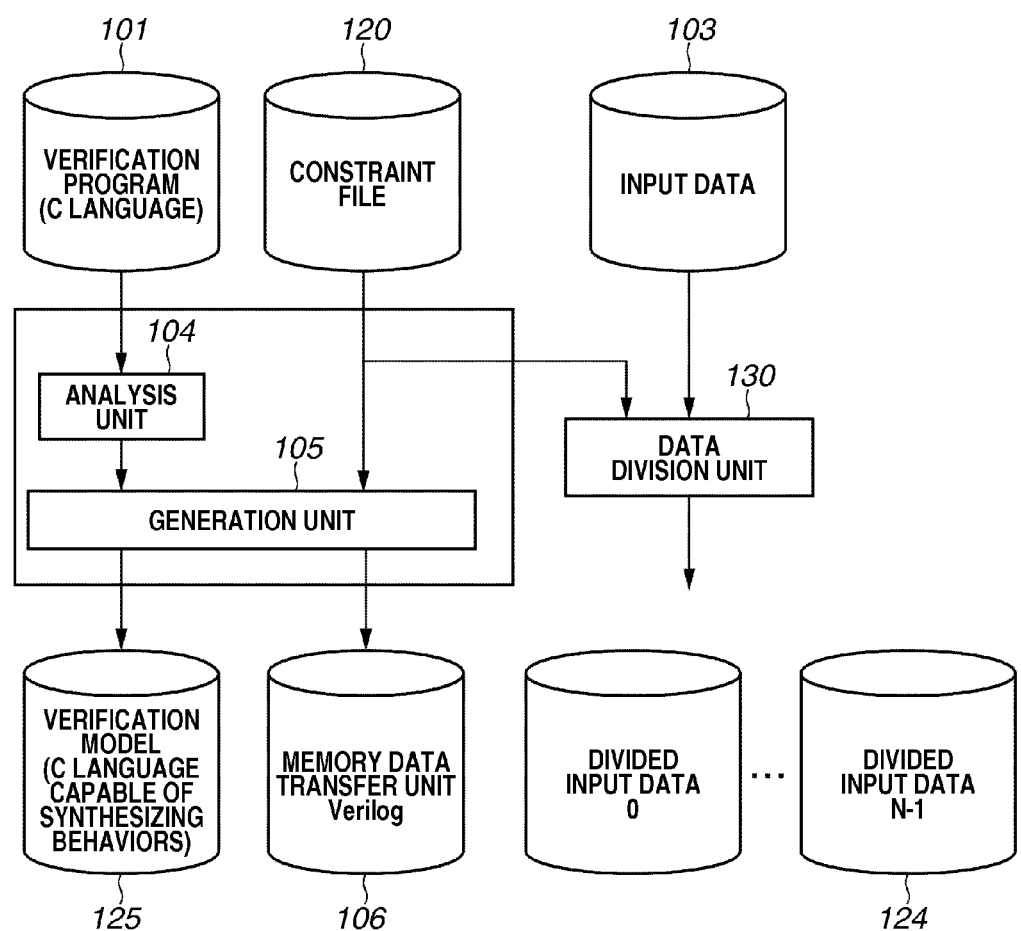
FIG. 5 illustrates an analysis unit and a generation unit.

Next, the first exemplary embodiment of the present invention will be described in detail using FIGS. 3A to 3D, FIGS. 4A to 4C, and FIG. 5. FIGS. 3A to 3D illustrate an outline of the procedure for building an environment used in the present exemplary embodiment. FIGS. 4A to 4C illustrate description examples of the verification program, a verification model, and a memory data transfer unit. FIG. 5 illustrates an outline configuration of the analysis unit and the generation unit used in the first exemplary embodiment. In the present exemplary embodiment, the size of the input data 103 is set to 32 bits×64,000 words and the size of the memory 112 is set to 32 bits×32 words. The size of the memory 112 is specified by a constraint file 120 in FIG. 5. The present exemplary embodiment is described by assuming that the size of the memory 112 is smaller than the size of the input data 103, but the size of the memory 112 may be equal to or larger than the size of the input data.

First, conversion from FIG. 3A to FIG. 3B will be described. Here, an input description example of the verification program 101 will be described using FIG. 4A. In the fourth line, a file called indata.bin corresponding to the input data 103 is opened by using a file function. The while statement in the sixth line loops until the last line of indata.bin read in the seventh line is read (EOF=End Of File) according to the description in the eighth line. Next, the verification program 101 supplies the input data 103 read in the seventh line to the verification target 102 via the function in the ninth line. In other words, the verification program shows that data transfer continues until all data of indata.bin is supplied to the verification target 102.

Figure 3A:
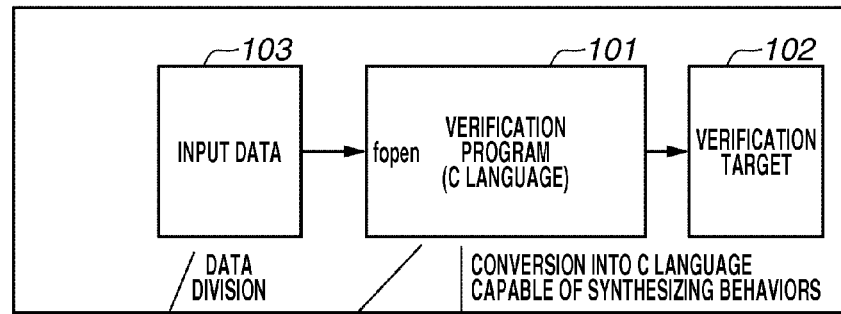
FIGS. 3A to 3D illustrate a procedure for building the emulation environment.
Figure 3B:
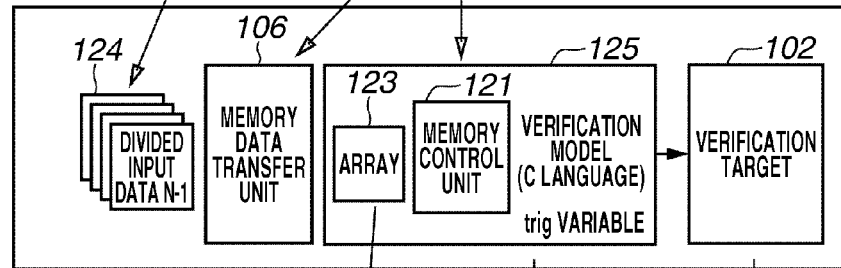

The verification target 102 in FIG. 3A is a behavior algorithm of a logic circuit and is described in the C language that allows behavioral synthesis. In the configuration in FIG. 3A, the verification target 102 can be verified by the input data 103 being supplied to the verification target 102 by the verification program 101.

Next, the procedure for generating a verification model (C language) 125 and the memory data transfer unit (verilog) 106 will be described using FIG. 5. First, the verification program 101 is input into the analysis unit 104. The analysis unit 104 analyzes whether there is any description of a file function in the verification program 101. The analysis unit 104 detects a description of a file function from the fourth line to the eleventh line in FIG. 4A of the verification program 101. When the analysis unit 104 detects the description of the file function, the generation unit 105 generates the verification model (C language) 125 and the memory data transfer unit (verilog) 106 from the verification program 101 and the constraint file 120. By converting the file function in this manner, a file pointer is made unnecessary. The verification model 125 is described in the C language that allows behavioral synthesis and the memory data transfer unit 106 is described in Verilog that can be implemented on the PC.

Figure 6:
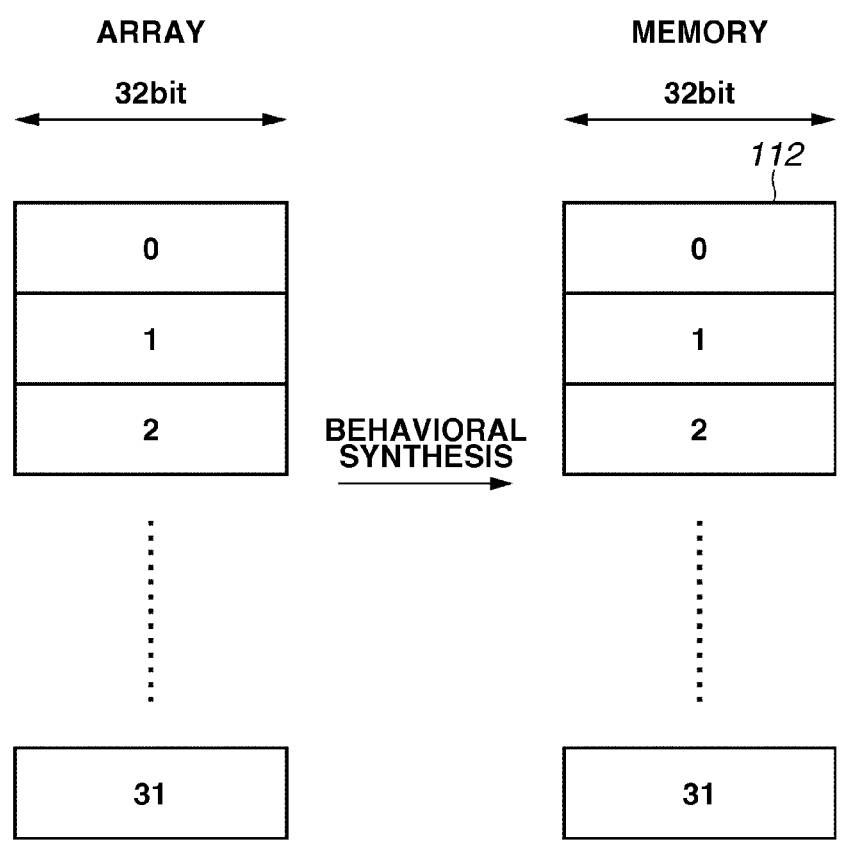
FIG. 6 illustrates behavioral synthesis from an array to a memory.

Next, a description of the verification model 125 generated by the generation unit 105 will be described using FIG. 4B. The first line is the declaration of an array mem. A behavioral synthesis tool implements the array mem declared like in FIG. 6 as a memory. The address of the array can be used unchanged as a memory address. Thus, it is necessary to decide the size of the array based on the size of the memory 112 specified by the constraint file 120. In other words, the size of the memory 112 is 32 bits×32 words and therefore, the array mem is an int type and the number of elements thereof is 32. Here, the int type is assumed to have 32 bits.

The number of times of looping of the for statement in the third line is the number of elements of the array mem. mem[i] in the fourth line reads data of the address specified by i from the array. The function out_data ( ) supplies the value of mem[i] of an argument to the verification target 102. With the above description, sequential output of data from mem[0] to mem[31] to the verification target 102 is realized. The function trig_out( ) in the sixth line shows output of a trigger from the verification model 125 to the PC after the behavioral synthesis. This description shows that a trigger is output to the PC after the verification model 125 supplies all elements of the array mem to the verification target 102.

Next, when the input data 103 and the constraint file 120 are input into a data division unit 130 in FIG. 5, the data division unit 130 divides the input data 103 into a plurality of pieces of divided input data having the same size as the memory size. The input data 103 has the size of 32 bits×64,000 words and the memory size is 32 bits×32 words and thus, the data division unit 130 divides the input data 103 into 20,000 pieces of divided input data 124. If the specified memory 112 has the same size as the size of the input data 103, there is no need to divide by the data division unit 130.

Next, a description of the memory data transfer unit 106 generated by the generation unit 105 will be described using FIG. 4C. The number of times of looping of the for statement in the first line specifies the number of pieces of the divided input data 124. The number of pieces of the divided input data 124 is 20,000, therefore 20,000 is specified as the number of times of looping. In the second line, the name of the file of the divided input data 124 to be transferred is specified. In the third line, the divided input data 124 specified in the second line is transferred to the memory 112. With the above description, the memory data transfer unit 106 is set to sequentially transfer 20,000 pieces of divided input data 124.

As described above, the verification model 125 in FIG. 3B, an array 123 in the verification model 125, a memory control unit 121, and the memory data transfer unit 106 are generated by the analysis unit 104 and the generation unit 105 based on the verification program 101 in FIG. 3A. Also, the divided input data 124 in FIG. 3B is generated by the data division unit 130 from the input data 103 in FIG. 3A.

Figure 3C:
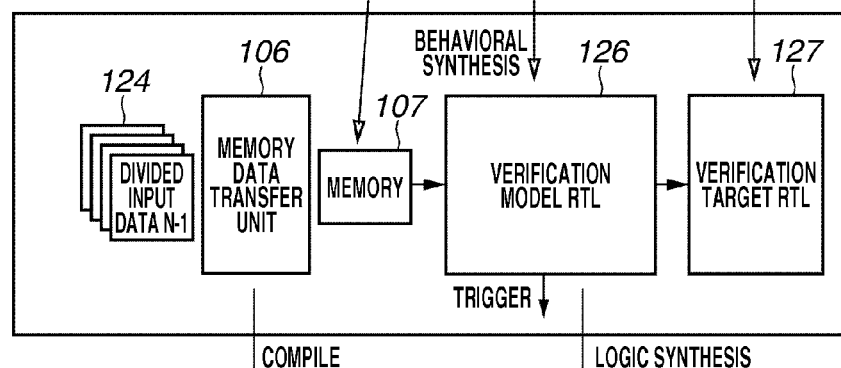

Next, processing to convert the state in FIG. 3B into the state in FIG. 3C will be described. By applying behavioral synthesis to the verification model 125 in FIG. 3B, a verification model (RTL) 126 in FIG. 3C described in a hardware description language of RTL allowing logic synthesis is output. Similarly, the verification target 102 outputs a verification target (RTL) 127 in FIG. 3C described in a hardware description language of RTL allowing logic synthesis by applying behavioral synthesis.

Figure 3D:
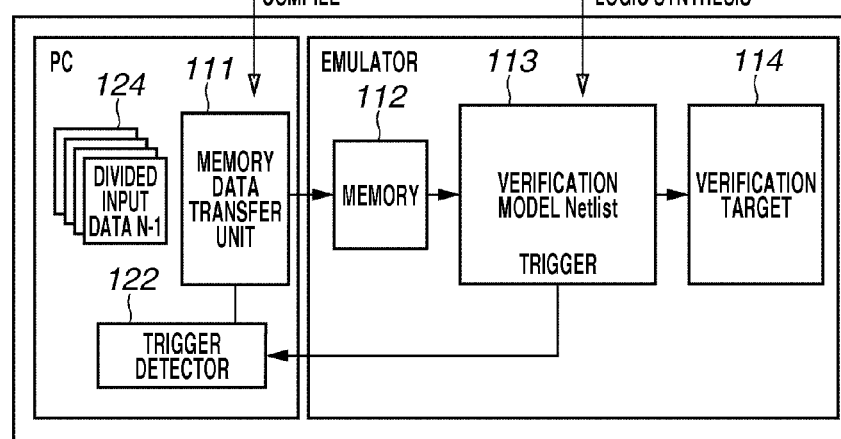

Next, processing to implement content in FIG. 3C on the PC and the emulator as illustrated in FIG. 3D will be described. By applying logic synthesis to the verification model (RTL) 126, the memory 107, and the verification target (RTL) 127 in FIG. 3C, the memory circuit 112, the verification model 113, and the verification target 114 are arranged on the emulator as a gate circuit (netlist). The memory data transfer unit 106 in FIG. 3C is implemented on the PC by the compiler as the memory data transfer unit 111.

Next, the behavior in verification by the emulator will be described using FIG. 3D. First, the memory data transfer unit 111 transfers the first piece of the divided input data 124 to the memory 112. When the transfer from the memory data transfer unit 111 to the memory 112 is finished, the verification model 113 reads data from the memory 112. The verification model 113 sequentially reads data from address 0 to address 31 in the memory 112 in FIG. 6 and supplies the read data to the verification target 114. When the verification model 113 reads data at address 31 in the memory 112 and finishes supplying data to the verification target 102, the verification model 113 outputs a trigger to the PC side. When the trigger detector 122 detects a trigger from the verification model 113, the memory data transfer unit 111 transfers the next pieces of divided input data 124 to the memory 107. The above processing is repeated for the 20,000 pieces of the divided input data 124 until the transfer is finished for verification.

In the present exemplary embodiment, as described above, when an emulation environment is created from a verification program containing a description of file input/output, an interface of file input/output is generated on the PC side by extracting any description of a file function to which it is difficult to apply logic synthesis. Accordingly, the configuration to be arranged on the emulator can easily be created by logic synthesis based on descriptions other than a description of a file function and therefore, the user can easily build a high-speed emulation environment.

In the first exemplary embodiment, a description example of the verification program 101 in the C language is shown, but a similar effect can be obtained by other languages such as C++/System C by a similar procedure. Further, a similar effect can be obtained even if the description style of a behavioral synthesis tool is modified.

Also, a description example of the verification target 102 in the C language is shown, but a similar effect can be obtained by other languages such as C++/System C or hardware description languages of RTL such as Verilog/VHDL. Further, a similar effect can be obtained even if the description style of a behavioral synthesis tool is modified.

Also, a description example of the verification model 125 generated by the generation unit 105 in the C language is shown, but a similar effect can be obtained by other languages such as C++/System C or hardware description languages of RTL such as Verilog/VHDL.

Also, a description example of the memory data transfer unit 106 generated by the generation unit 105 in Verilog is shown, but a similar effect can be obtained by other languages such as C++/System C or hardware description languages of RTL such as VHDL.

By automatically generating a verification model and a memory data transfer unit as described above, a high-speed emulation environment can be built in a short time.

The present invention may also be realized by supplying a storage medium that stores a program causing a computer to realize the function of the above exemplary embodiment to a system or an apparatus.

As the storage medium, for example, a flexible disk, optical disk, magneto-optical disk, compact disk read-only memory (CD-ROM), compact disk recordable (CD-R), magnetic tape, nonvolatile memory card, flash memory, or solid state disk (SSD) can be used.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-262872 filed Nov. 25, 2010, which is hereby incorporated by reference herein in its entirety.

What is claimed is:

1. An information processing apparatus connected to an emulator to arrange a logic circuit of a verification target, comprising:

a compile unit configured to create a logic circuit of a first data transfer unit arranged in a computer to transfer input data from the computer to the emulator, from the first data transfer unit based on a description of a verification program concerning input data; and a generation unit configured to generate a second data transfer unit that receives the data from the first data transfer unit and transfers the received data to the verification target based on the description of the verification program concerning the input data.

2. The information processing apparatus according to claim 1, further comprising an output unit configured to arrange the second data transfer unit created by the generation unit on the emulator by an input/output unit of the computer.

3. The information processing apparatus according to claim 2,
wherein the generation unit generates the verification model and the verification target, and
wherein the output unit arranges the verification model and the verification target generated by the generation unit on the emulator.

4. The information processing apparatus according to claim 1, wherein the description of the verification program concerning the input data is detected, and the verification program is converted so that behavioral synthesis can be applied to the verification program.

5. An information processing apparatus, comprising:
a determination unit configured to determine whether at least one of behavioral synthesis and logic synthesis of each description of a verification program can be performed;
a generation unit configured to generate, from a verification program, a description concerning data transferring that can be implemented on a computer and a description that behavioral synthesis can be performed on when the determination unit determines the description that behavioral synthesis cannot be applied to is included in the verification program;
a compile unit configured to compile a first logic circuit from the generated description concerning the data transferring that can be implemented on the computer; and
a synthesis unit configured to synthesize a second logic circuit by performing the behavioral synthesis and the logic synthesis based on the generated description that behavioral synthesis can be performed on.

6. An information processing method by a computer connected to an emulator to arrange a logic circuit of a verification target, comprising:
compiling of creating a logic circuit of a first data transfer unit arranged in the computer to transfer input data from the computer to the emulator, from the first data transfer unit based on a description of a verification program concerning input data; and
generating a second data transfer unit configured to receive the data from the first data transfer unit and transfer the received data to the verification target based on the description of the verification program concerning the input data.

7. The information processing method according to claim 6, wherein the description of the verification program concerning the input data is detected, and the verification program is converted so that behavioral synthesis can be applied to the verification program.

8. An information processing method for generating an emulation environment based on a verification program, comprising:

determining whether at least one of behavioral synthesis and logic synthesis of each description of the verification program can be performed;
generating, from a verification program, a description concerning data transferring that can be implemented on a computer and a description that behavioral synthesis can be performed on when the determination unit determines the description that behavioral synthesis cannot be applied to is included in the verification program;
compiling a first logic circuit from the generated description concerning the data transferring that can be implemented on the computer; and
synthesizing a second logic circuit by performing the behavioral synthesis and the logic synthesis based on the generated description that behavioral synthesis can be performed on.

9. An information processing apparatus connected to an emulator to arrange a logic circuit of a verification target, comprising:
a compile unit configured to create a logic circuit of a first data transfer unit arranged in the information processing apparatus to transfer input data from the information processing apparatus to the emulator, from the first data transfer unit based on a description of a verification program concerning input data; and
a generation unit configured to generate a second data transfer unit that receives the data from the first data transfer unit and transfers the received data to the verification target based on the description of the verification program concerning the input data.

10. The information processing apparatus according to claim 9, wherein the description of the verification program concerning the input data is detected, and the verification program is converted so that behavioral synthesis can be applied to the verification program.

11. An information processing apparatus that generates an emulation environment based on a verification program, comprising:
a determination unit configured to determine whether at least one of behavioral synthesis and logic synthesis of each description of the verification program can be performed;
a generation unit configured to generate, from a verification program, a description concerning data transferring that can be implemented on a computer and a description that behavioral synthesis can be performed on when the determination unit determines the description that behavioral synthesis cannot be applied to is included in the verification program;
a compile unit configured to compile a first logic circuit from the generated description concerning the data transferring that can be implemented on the computer; and
a synthesis unit configured to synthesize a second logic circuit by performing the behavioral synthesis and the logic synthesis based on the generated description that behavioral synthesis can be performed on.

* * * * *